(12) United States Patent
Herbsommer et al.

(10) Patent No.: US 8,049,312 B2
(45) Date of Patent: Nov. 1, 2011

(54) SEMICONDUCTOR DEVICE PACKAGE AND METHOD OF ASSEMBLY THEREOF

(75) Inventors: Juan Alejandro Herbsommer, Schnecksville, PA (US); Jonathan A. Noquil, Lapu Lapu (PH); Osvaldo J. Lopez, Annandale, NJ (US)

(73) Assignee: Texas Instruments Incorporated, Dallas, TX (US)

( * ) Notice: Subject to any disclaimer, the term of this patent is extended or adjusted under 35 U.S.C. 154(b) by 379 days.

(21) Appl. No.: 12/352,215

(22) Filed: Jan. 12, 2009

(65) Prior Publication Data

US 2010/0176508 A1 Jul. 15, 2010

(51) Int. Cl.
*H01L 23/495* (2006.01)
*H01L 23/10* (2006.01)

(52) U.S. Cl. . 257/666; 257/706; 257/713; 257/E23.039; 257/673

(58) Field of Classification Search ............ 257/666, 257/706, 713, E23.039
See application file for complete search history.

(56) References Cited

U.S. PATENT DOCUMENTS

| | | | |
|---|---|---|---|
| 5,625,226 A | 4/1997 | Kinzer | |
| 5,977,630 A | 11/1999 | Woodworth et al. | |
| 6,040,626 A | 3/2000 | Cheah et al. | |
| 6,075,286 A | 6/2000 | Ewer | |
| 6,242,800 B1 | 6/2001 | Munos et al. | |
| 6,262,489 B1 | 7/2001 | Koors et al. | |
| 6,396,127 B1 | 5/2002 | Munoz et al. | |
| 6,404,050 B2 | 6/2002 | Davis et al. | |
| 6,482,680 B1 | 11/2002 | Khor et al. | |
| 6,489,678 B1 | 12/2002 | Joshi | |
| D471,165 S | 3/2003 | Williams et al. | |
| D472,528 S | 4/2003 | Kasem et al. | |
| 6,586,824 B1 | 7/2003 | Glenn et al. | |
| 6,593,622 B2 | 7/2003 | Kinzer et al. | |
| 6,600,182 B2 | 7/2003 | Rumennik | |
| 6,611,047 B2 | 8/2003 | Hu et al. | |
| 6,617,655 B1 | 9/2003 | Estacio et al. | |
| 6,627,976 B1 | 9/2003 | Chung et al. | |
| 6,630,726 B1 | 10/2003 | Crowley et al. | |
| 6,638,790 B2 | 10/2003 | Minamio et al. | |
| 6,639,308 B1 | 10/2003 | Crowley et al. | |
| 6,645,791 B2 | 11/2003 | Noquil et al. | |
| 6,646,329 B2 | 11/2003 | Estacio et al. | |
| 6,653,740 B2 | 11/2003 | Kinzer et al. | |
| 6,661,082 B1 | 12/2003 | Granada et al. | |
| 6,677,663 B1 | 1/2004 | Ku et al. | |
| 6,677,669 B2 | 1/2004 | Standing | |
| 6,696,321 B2 | 2/2004 | Joshi | |
| 6,696,747 B1 | 2/2004 | Lee et al. | |

(Continued)

OTHER PUBLICATIONS

Bai, et al., "Comparative Thermal and Thermomechanical Analyses of Solder-Bump and Direct-Solder Bonded Power Device Packages Having Double-Sided Cooling Capability," IEEE, 2004.

(Continued)

*Primary Examiner* — Nitin Parekh

(74) *Attorney, Agent, or Firm* — Yingsheng Tung; Wade J. Brady, III; Frederick J. Telecky, Jr.

(57) ABSTRACT

A semiconductor die package includes: an assembly including a semiconductor die, a clip structure attached to an upper surface of the semiconductor die, and a heat sink attached to an upper surface of the clip structure; and a molding material partially encapsulating the assembly, wherein an upper surface of the heat sink is exposed through the molding material.

5 Claims, 7 Drawing Sheets

U.S. PATENT DOCUMENTS

| | | | |
|---|---|---|---|
| 6,700,187 B2 | 3/2004 | Paek | |
| 6,707,138 B2 | 3/2004 | Crowley et al. | |
| 6,713,322 B2 | 3/2004 | Lee | |
| 6,723,582 B2 | 4/2004 | Glenn et al. | |
| 6,730,544 B1 | 5/2004 | Yang | |
| 6,744,124 B1 | 6/2004 | Chang et al. | |
| 6,753,605 B2 | 6/2004 | Joshi | |
| 6,756,658 B1 | 6/2004 | Gillett et al. | |
| 6,762,067 B1 * | 7/2004 | Quinones et al. | 438/11 |
| 6,773,964 B2 | 8/2004 | Fan | |
| 6,777,800 B2 * | 8/2004 | Madrid et al. | 257/690 |
| 6,818,973 B1 | 11/2004 | Foster | |
| 6,838,309 B1 | 1/2005 | McCann | |
| 6,844,615 B1 | 1/2005 | Edwards et al. | |
| 6,846,704 B2 | 1/2005 | Paek | |
| 6,847,103 B1 | 1/2005 | Perez et al. | |
| 6,853,060 B1 | 2/2005 | Seok et al. | |
| 6,858,919 B2 | 2/2005 | Seo et al. | |
| 6,873,041 B1 | 3/2005 | Crowley et al. | |
| 6,841,414 B1 | 5/2005 | Hu et al. | |
| 6,891,256 B2 | 5/2005 | Joshi et al. | |
| 6,943,434 B2 | 9/2005 | Tangpuz et al. | |
| 7,126,193 B2 | 10/2006 | Baiocchi et al. | |
| 7,166,496 B1 | 1/2007 | Lopez et al. | |
| 7,235,845 B2 | 6/2007 | Xu et al. | |
| 7,282,765 B2 | 10/2007 | Xu et al. | |
| 7,285,849 B2 | 10/2007 | Cruz et al. | |
| 7,420,247 B2 | 9/2008 | Xu et al. | |
| 7,446,375 B2 | 11/2008 | Xu et al. | |
| 7,663,211 B2 * | 2/2010 | Noquil et al. | 257/675 |
| 7,800,219 B2 * | 9/2010 | Jeon et al. | 257/706 |
| 2001/0030362 A1 | 10/2001 | Grant | |
| 2001/0045627 A1 | 11/2001 | Connah et al. | |
| 2001/0048116 A1 | 12/2001 | Standing et al. | |
| 2001/0048154 A1 | 12/2001 | Cheah et al. | |
| 2001/0052639 A1 | 12/2001 | Jeon et al. | |
| 2002/0008319 A1 | 1/2002 | Davis et al. | |
| 2002/0066950 A1 | 6/2002 | Joshi | |
| 2002/0070441 A1 | 6/2002 | Cheah | |
| 2002/0135079 A1 | 9/2002 | Shivkumar et al. | |
| 2002/0163040 A1 | 11/2002 | Kinzer et al. | |
| 2003/0011005 A1 | 1/2003 | Joshi | |
| 2003/0016505 A1 | 1/2003 | Jauregui | |
| 2003/0067071 A1 | 4/2003 | Cardwell | |
| 2003/0075786 A1 | 4/2003 | Joshi et al. | |
| 2003/0107126 A1 | 6/2003 | Joshi et al. | |
| 2003/0122247 A1 | 7/2003 | Joshi et al. | |
| 2004/0021233 A1 | 2/2004 | Kinzer et al. | |
| 2004/0061221 A1 | 4/2004 | Schaffer | |
| 2004/0159939 A1 | 8/2004 | Joshi et al. | |
| 2004/0164386 A1 | 8/2004 | Joshi et al. | |
| 2004/0201086 A1 | 10/2004 | Joshi et al. | |
| 2005/0179143 A1 | 8/2005 | Moxham | |
| 2007/0040254 A1 | 2/2007 | Lopez et al. | |
| 2007/0045785 A1 * | 3/2007 | Noquil | 257/666 |
| 2007/0085204 A1 | 4/2007 | Korec et al. | |
| 2007/0114352 A1 * | 5/2007 | Cruz et al. | 248/316.7 |
| 2007/0132073 A1 * | 6/2007 | Tiong et al. | 257/666 |
| 2007/0138548 A1 | 6/2007 | Kocon et al. | |
| 2008/0036078 A1 | 2/2008 | Herbsommer et al. | |
| 2008/0054438 A1 | 3/2008 | Germain et al. | |
| 2008/0197411 A1 | 8/2008 | Korec et al. | |
| 2008/0246086 A1 | 10/2008 | Korec et al. | |
| 2010/0164078 A1 * | 7/2010 | Madrid et al. | 257/675 |

OTHER PUBLICATIONS

Jon Mark Hancock, Infineon Technologies NA, Inc., "The future of discrete power in VRM solutions; LV device roles and silicon/package technology to meet upcoming mainstream power delivery requirements," (Intel Technology Symposium 2003).

* cited by examiner

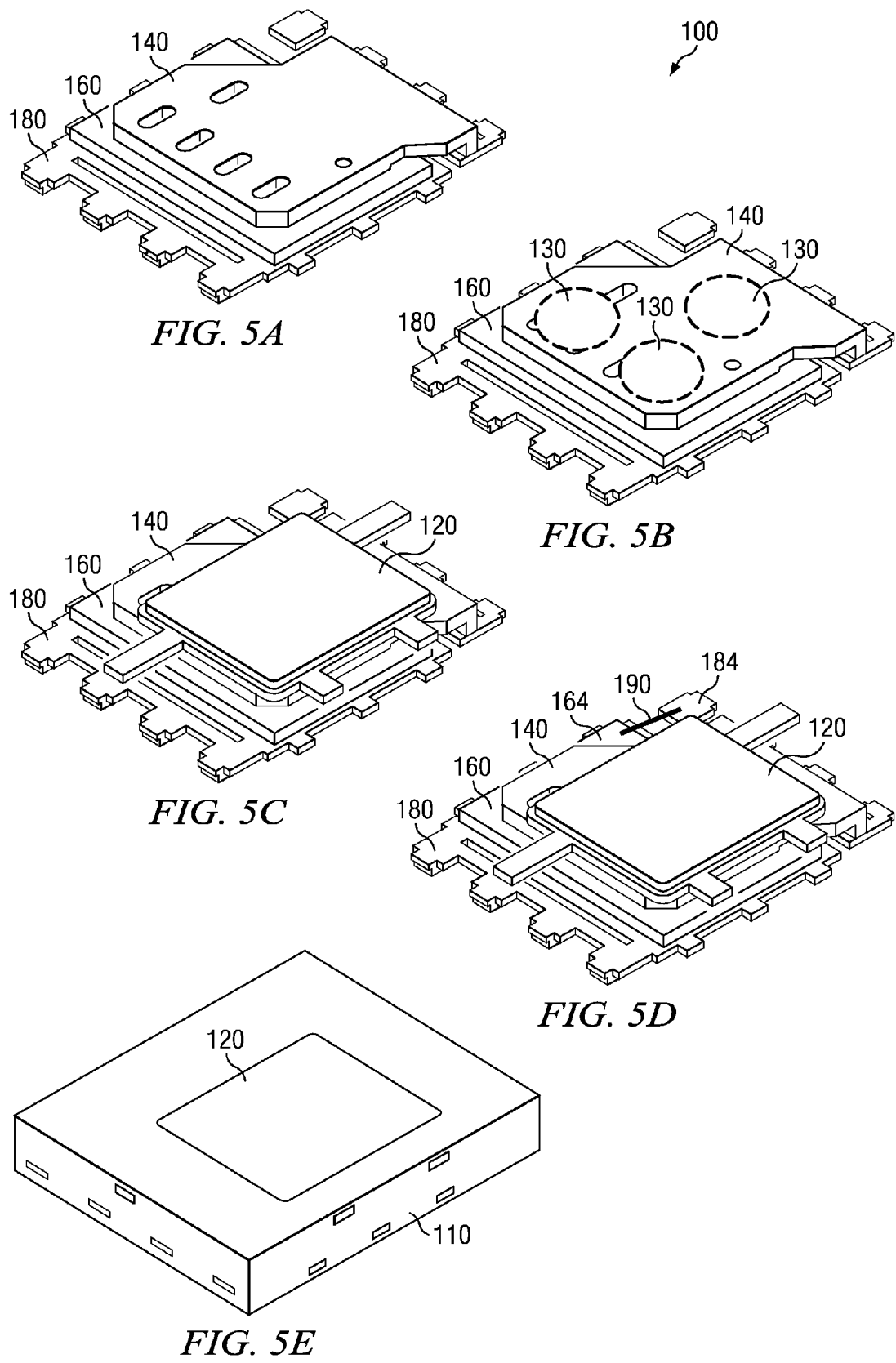

SEMICONDUCTOR DEVICE PACKAGE AND METHOD OF ASSEMBLY THEREOF

FIELD OF THE INVENTION

The present invention relates generally to electronic devices and more specifically to semiconductor packages and method of assembly.

BACKGROUND OF THE INVENTION

It is conventional in the electronic industry to encapsulate one or more semiconductor devices in a semiconductor package. These plastic packages protect a chip from environmental and handling hazards and provide a vehicle for electrical and mechanical attachment of the chip to an intended device. The packaging of semiconductor components such as power semiconductor devices involves a number of design challenges, such as cost, heat dissipation, device protection, size, performance, and reliability among others.

Various approaches to packaging semiconductor devices have been documented in the literature as well as commercialized. Some approaches use lead frames that are stamped into the desired lead configuration on which semiconductor devices are attached and wire bonded prior to encapsulation followed by post-encapsulation lead forming, i.e., lead bending and shaping to the desired configuration. This packaging technique requires custom trimming and forming machinery and tools. These trimming and forming steps and requisite machinery along with the solder or epoxy die attachment and wire bonding, ribbon bonding or clip bonding add to production time, complexity and cost.

Many semiconductor die packages use clips instead of wires to form external connections to external terminals. Such semiconductor die packages are sometimes referred to as "wireless" packages. A typical wireless package includes a clip that is attached to a semiconductor die. Wireless packages generally have better electrical and thermal performance than packages that use wire-based electrical connections. One such approach is the so-called quad flat pack no-lead (QFN) package.

As noted above, one principal consideration in the package design is heat dissipation. With respect to QFN packages, by way of example, conventional QFN packages dissipate heat from the exposed surface of the lead frame at the bottom of the package. In addition to dissipating heat from the bottom surface of the package, it can also be desirable to dissipate heat from the upper surface of a device package to pull heat away from a circuit board on which the device is mounted. Although dual heat dissipation (i.e., from both upper and lower surface of a packaged device) can provide some dissipation advantages, manufacturing and performance challenges exist that prevent these packages from being optimally reliable and cost effective. Such challenges include exposed semiconductor die surfaces, inconsistent alignment of components, and non-standardized designs that require expensive tool modifications, to name a few.

Accordingly, new package structures and methods of assembling the same are desired.

SUMMARY OF THE INVENTION

A semiconductor die package includes an assembly including a semiconductor die, a clip structure attached to an upper surface of the semiconductor die, and a heat sink attached to an upper surface of the clip structure. A molding material partially encapsulates the assembly, wherein an upper surface of the heat sink is exposed through the molding material.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which:

FIG. 5 illustrates an alternative method of forming a packaged semiconductor device;

DETAILED DESCRIPTION

Figure 1A:
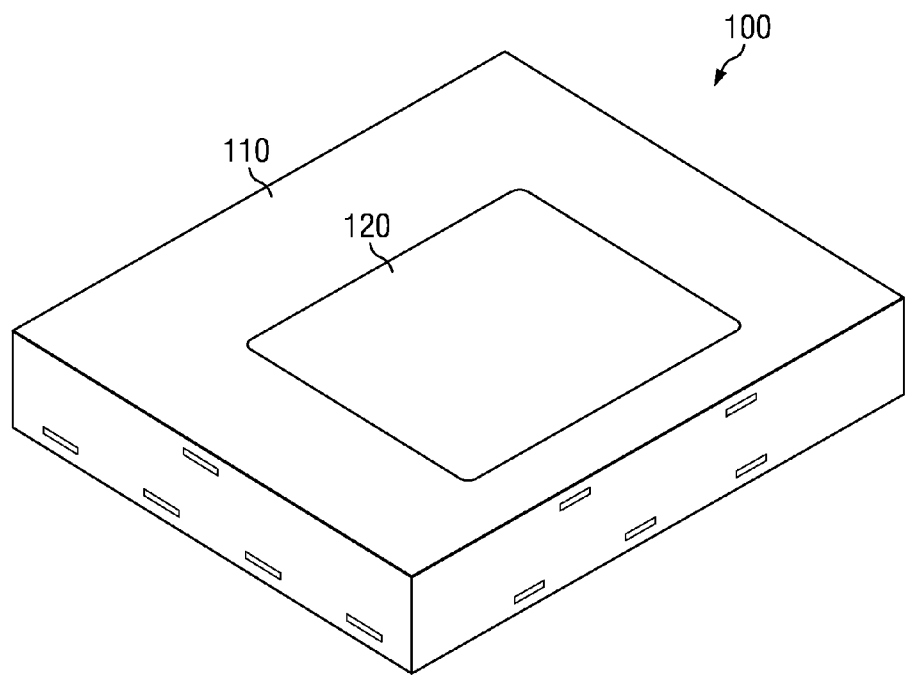
FIG. 1A is a top perspective view of a packaged semiconductor device having an exposed heat sink according to an embodiment of the present invention.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

A semiconductor device package is described herein having improved heat dissipation from a top surface thereof. The device package is particularly useful for packaging power MOSFET devices, such as power switches, which have large current capabilities (e.g., 25-30 A) and thus generate significant heat. Dissipating at least some of this heat from a top surface of the packaged device prevents at least some of the heat from being dissipated into the substrate (e.g., printed circuit board (PCB)) on which the device is mounted. Preventing heat dissipation into a PCB substrate is of particular desirability when several devices are mounted on a common board.

Figure 1B:
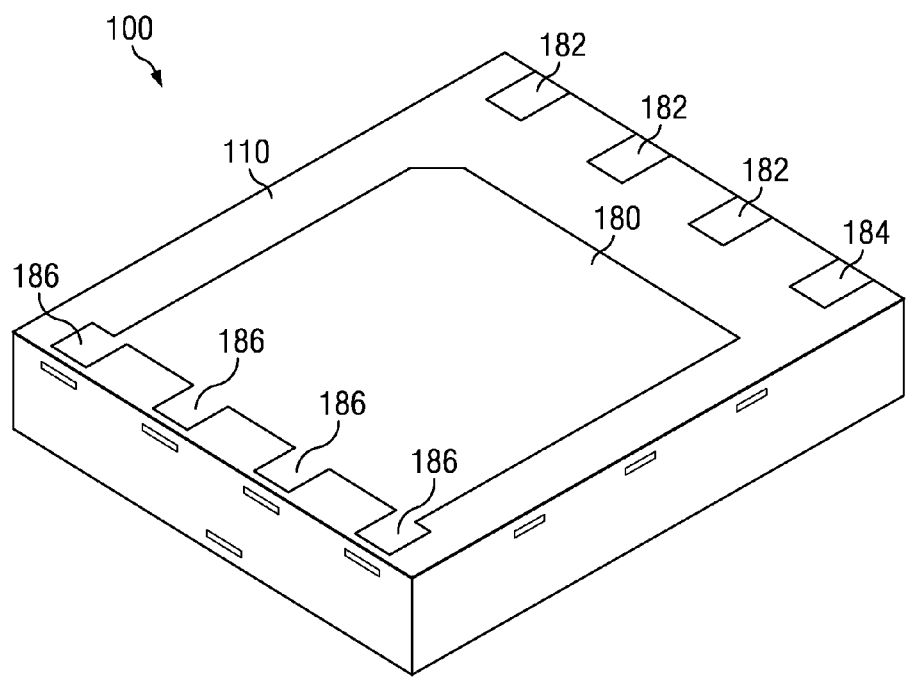
FIG. 1B is a bottom perspective view of the packaged semiconductor device of FIG. 1.

FIG. 1A is a top perspective view of a packaged semiconductor device 100 according to an embodiment of the invention. FIG. 1B is a bottom perspective view of the packaged semiconductor device. In embodiments, the device packaging is a QFN package having a standard So-8 footprint. However, those familiar with package designs will understand that the heat dissipation techniques described herein may be applied to other package techniques such as wireless So-8 leaded, wireless TO-220, or others. As can be seen in the figures, the packaged semiconductor device 100 has a heat sink 120 (also sometime referred to herein as a "heat slug") at its top surface that is exposed through the molding material 110. As shown in FIG. 1B, in this embodiment, the lead frame 180 is also exposed through the molding material 120 at the bottom of the device 100, providing a second major heat dissipation surface.

The molding material 110 may be an epoxy molding material or any other suitable commercially available molding material. In one exemplary embodiment, the molding material is a CEL series epoxy molding compound available from HITACHI Chemical Co.

Figure 2:
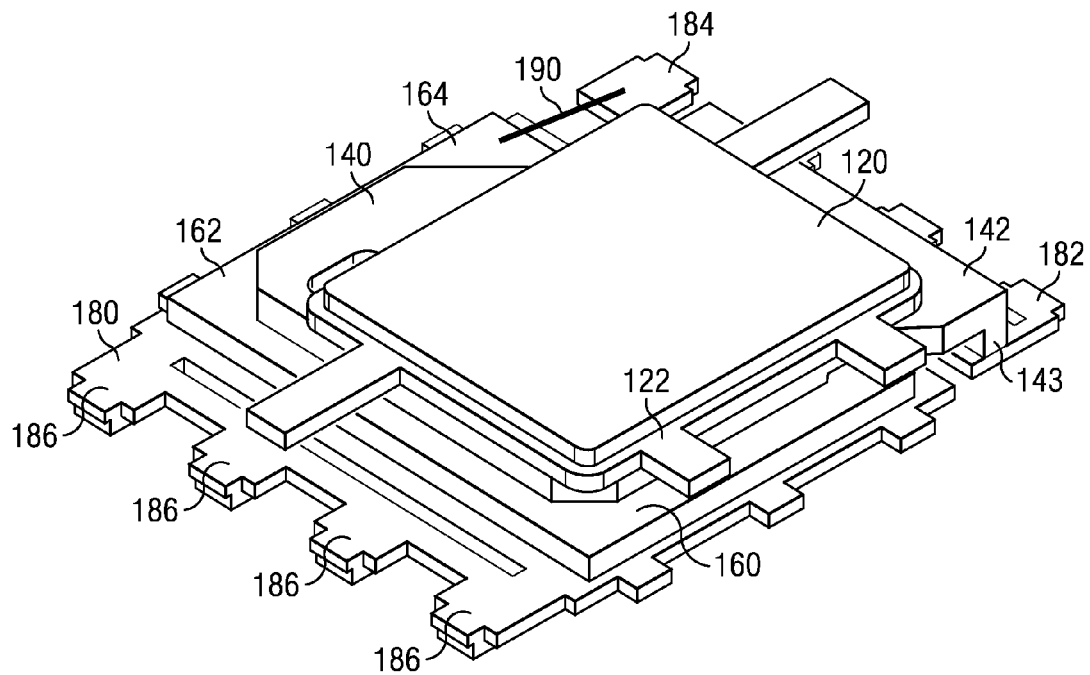
FIG. 2 is a top perspective view of the packaged semiconductor device of claim 1 with the molding material hidden to show the packaged components thereof.
Figure 3:
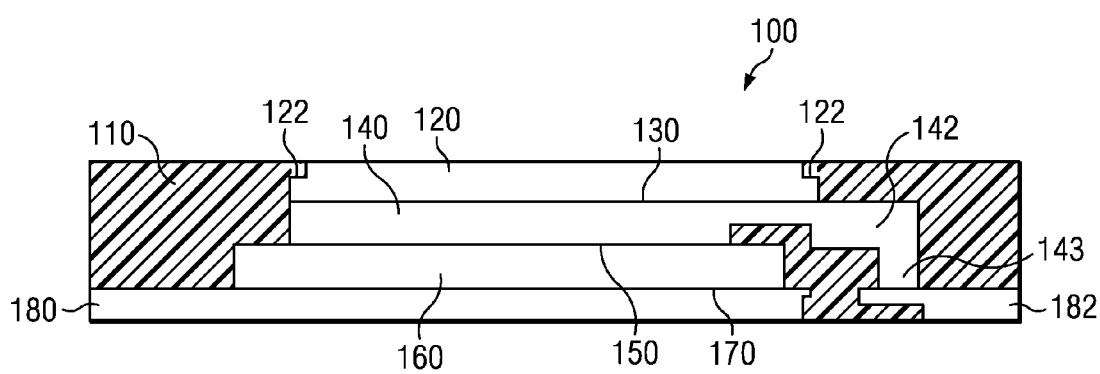
FIG. 3 is a cross-sectional view of the packaged semiconductor device of FIGS. 1A and 1B.
Figure 4A:
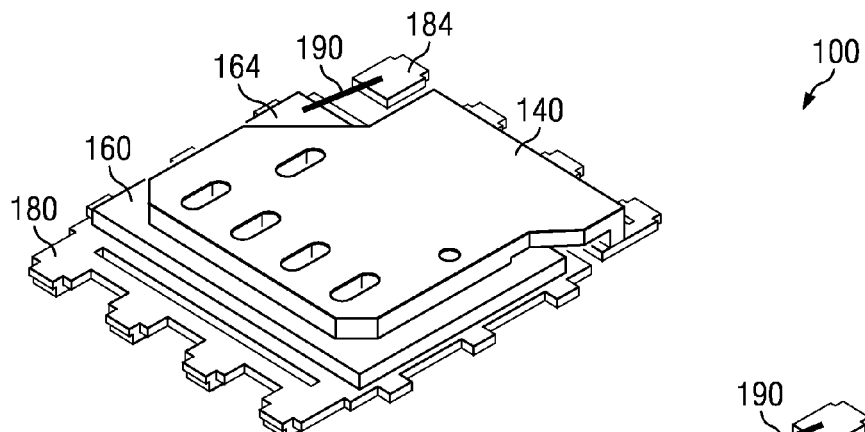
FIG. 4 illustrates one method of forming a packaged semiconductor device.
Figure 4B:
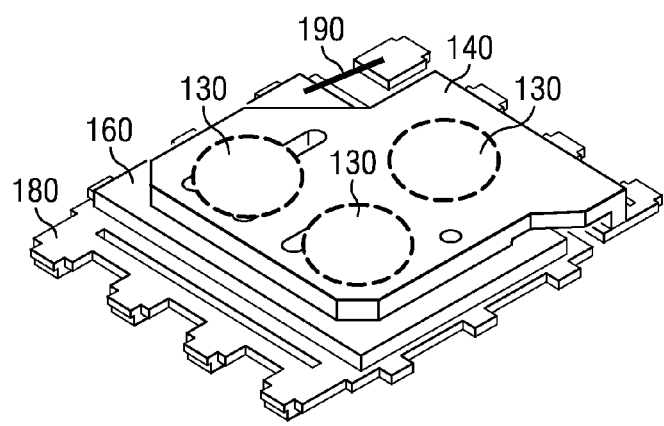
Figure 4C:
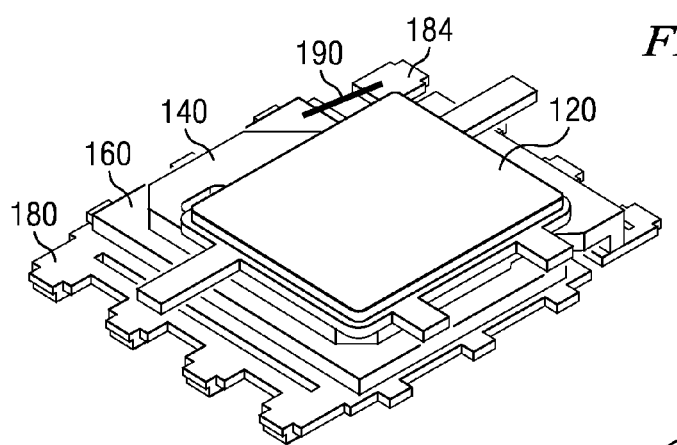
Figure 4D:
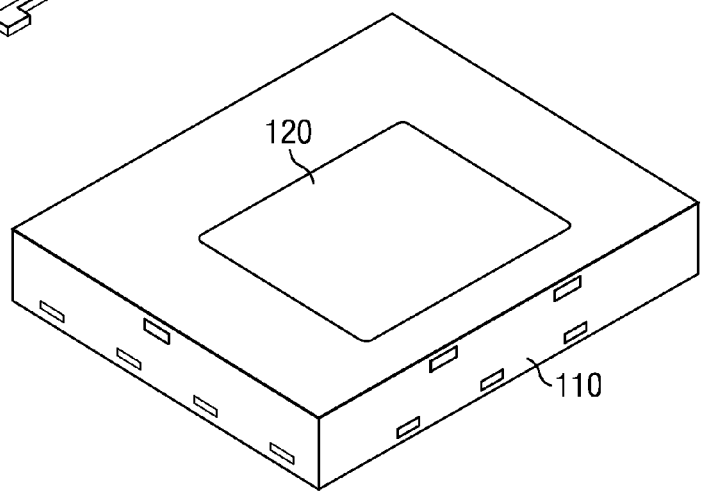

FIG. 2 is a top perspective view of an assembly of components inside the protective molding material 110 of the packaged semiconductor device of FIGS. 1A and 1B. FIG. 3 is a cross-sectional view of the packaged device of FIGS. 1A and 1B showing the assembly of FIG. 2. As can be seen from the figures, the assembly includes, from top to bottom, heat sink 120, adhesive layer 130, clip structure 140, conductive adhesive layer 150, semiconductor die 160, conductive adhesive layer 170 and lead frame 180. In more detail, the bottom surface of the heat sink 120 is attached to the top surface of the clip structure 140 by adhesive layer 130. Adhesive layer 130 can be a conductive or nonconductive adhesive layer. In embodiments, the adhesive layer is a non-conductive epoxy material. More preferably, the adhesive layer is the same conductive solder layer used for conductive adhesive layers 150, 170, such as a lead-tin solder. As those in the art will recognize, the bottom surface of the clip structure 140 is attached to the top surface of the semiconductor die 160 by the conductive adhesive layer 150. The bottom surface of the die 160 is attached to the top surface of the lead frame 180 by conductive adhesive layer 170.

The heat sink 120 and the clip structure are preferably formed from copper. The exposed surface of the heat sink 120 provides a highly thermally conductive surface to which an external heat sink can be attached in a product. The lead frame is preferably formed from selectively Ag plated copper.

In exemplary embodiments, the semiconductor die 160 is a power MOSFET transistor such as a vertical MOSFET. The vertical MOSFET includes a source region (not labeled) and a gate region 164 at a top surface 162 of the die 160 and a drain region at the (i.e., bottom) surface. The source region may have a source metal (e.g., an Aluminum layer, a solderable top metal or solder bumps) and is electrically coupled to a source clip portion 142 of the clip structure 140. The gate region 164 of the die 160 is electrically coupled by a gold, aluminum or copper wirebond 190 to a gate lead portion 184 of the lead frame 180. Alternatively, as described in more detail in connection with FIG. 7, the clip structure can include a gate clip portion for coupling gate region 164 to gate lead portion 184. The source clip portion 142 has a downset portion or arm 143 that electrically couples to the source lead portion 182 of the lead frame 180. The bottom surface of the die 160 includes a drain region that is electrically coupled to the lead frame and its drain lead portions 186.

As explained above, in embodiments the bottom of the lead frame structure 180 is exposed through the molding material 110. The exposed bottom surface of the lead frame 180 provides for an additional drain connection (i.e., in addition to drain leads 186) as well as an additional cooling path for the semiconductor die package 100.

As can be seen in the assembly view of FIG. 2 and the cross section of FIG. 3, in embodiments the heat sink 120 includes a shelf, step or ledge 122 formed around at least a part of the periphery of the heat sink 120. This shelf is overmolded with the molding material 110, helping to secure heat sink 120 within the packaged device 100.

In exemplary embodiments, the components illustrated in FIGS. 1-3 have the following target thicknesses:

| Package Component | 4 mils die | 8 mils die |
| --- | --- | --- |
| Lead frame 180 | 0.200 mm | 0.200 mm |
| Adhesive layer 170 | 0.025 mm | 0.025 mm |
| Die 160 | 0.100 mm | 0.200 mm |
| Adhesive layer 150 | 0.025 mm | 0.025 mm |
| Clip structure 140 | 0.250 mm | 0.250 mm |
| Adhesive layer 130 | 0.025 mm | 0.025 mm |
| Heat sink 120: | 0.250 mm | 0.250 mm |
| Total Package Thickness | 0.875 +/- 0.05 mm | 0.975 +/- 0.05 mm |

The thickness of the device can be modified by further thinning of the heat sink 120 to a targeted thickness.

Figure 11:
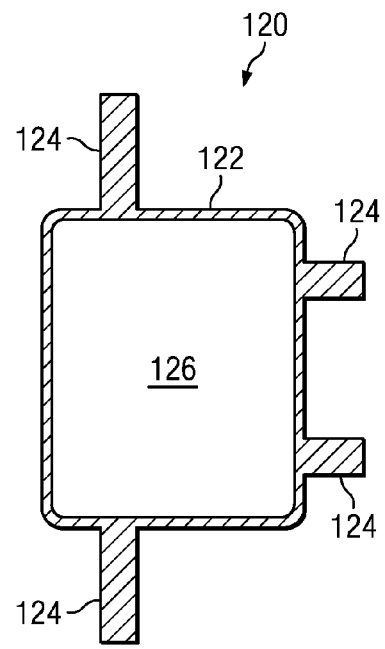
FIG. 11 is a top plan view of an exemplary embodiment of a heat sink.

FIG. 11 is a top plan view of an exemplary embodiment of the heat sink 120. The cross-hatch illustrates regions of reduced thickness half-etched from the upper surface 126, including arms 124 and ledge 122. The upper surface 126 has dimensions of about 3.36×2.82 mm. The arms 124 each have a width of about 0.4 mm, and the ledge has a width of about 0.1 mm extending around the periphery of upper surface 126. Those skilled in this art will recognize that this heat sink design is particularized for the standard QFN So-8 package footprint but can easily be modified to other package formats. The heat sink design can also be used with dies having varied dimensions within a given package format without redesign.

FIG. 4 illustrates one method of forming a packaged semiconductor device 100. More specifically, the method illustrated in FIG. 4 uses a highly thermally conductivity epoxy to couple the heat sink 120 to the clip structure 140. At step (a), an assembly containing the lead frame 180, die 160 and clip structure 140 is provided. Though not shown, the assembly also includes conductive adhesive layers 150 and 170, e.g., solder layers. As can be seen at (a), the gate lead portion 184 of the lead frame 180 is wirebonded to the gate region 164 of the top surface of the die 160. An exemplary process flow for forming the assembly shown at (a) includes: (i) providing lead frame 180; (ii) applying solder to the top surface of lead frame 180; (iii) attaching the die 160 to the top surface of the lead frame 180; (iv) applying solder to the top surface of die 160; (v) attaching clip structure 140 to the top surface of die 160; (vi) heating the assembly to reflow the solder; (vii) performing a cleaning process; and (viii) providing wirebond connection 190.

At step (b), a highly thermally conductivity epoxy is applied to the top surface of the clip structure 140.

Next, at step (c), the heat sink 120 is disposed on the top surface of the clip structure 140 and the assembly is heated to cure the epoxy, thereby adhering the heat sink 120 to the clip structure 140.

Last, at step (d), the assembly of step (c) is overmolded with the molding material 110 to form packaged semiconductor device 100 having an exposed heat sink 120 at the top surface thereof and an exposed heat sink (in the form of lead frame 180) at the bottom surface thereof. If multiple chips are formed in the same mold, a sawing/cutting or other singulation process is performed to provide packaged semiconductor device 100. Those familiar with molding processes will understand that substrates such as tapes can be employed to prevent the overmolding of surfaces that are intended to be left exposed, such as the heat sink 120 and lead frame 180.

FIG. 5 illustrates an alternative method of forming a packaged semiconductor device 100. This illustrated method utilizes a conductive solder layer as the adhesive layer 130 between the clip structure 140 and the heat sink 120 rather than a thermally conductive epoxy. At step (a), an assembly is provided again including a stack including the clip structure 140, die 160 and lead frame 180. Though not shown, these layers are adhered together by conductive adhesive layers 150 and 170 provided between these layers. Unlike the illustration of step (a) from FIG. 4, this assembly does not include the wirebond between the gate lead portion 184 and the gate region 164 of the semiconductor die 160. An exemplary process flow for forming the assembly shown at (a) includes: (i) providing lead frame 180; (ii) applying solder to the top surface of lead frame 180; (iii) attaching the die 160 to the top surface of the lead frame 180; (iv) applying solder to the top surface of die 160; and (v) attaching clip structure 140 to the top surface of die 160.

At step (b), a conductive solder paste is applied to the top surface of the clip structure 140.

At step (c), the heat sink 120 is disposed on the top surface of the clip structure 140. The assembly of step (c) is then heated to reflow all three solder layers (i.e., layer 170 between lead frame 180 and die 160, layer 150 between die 160 and clip structure 140, and the solder layer 130 from step (c) disposed between the clip 140 and the heat sink 120). A cleaning process is then performed.

Next, at step (d), the gate lead portion 184 of the lead frame 180 is wirebonded to the gate region 164 of the semiconductor die 160.

Last, at step (e), the assembly of step (d) is overmolded with the molding material 110 to form packaged semiconductor device 100 having an exposed heat sink 120 at the top surface thereof and an exposed heat sink (in the form of lead frame 180) at the bottom surface thereof. If multiple chips are formed in the same mold, a sawing or other singulation process is performed to provide packaged semiconductor device 100. Those familiar with molding processes will understand that substrates such as tapes can be employed to prevent the overmolding of surfaces that are intended to be left exposed, such as the heat sink 120 and lead frame 180.

Figure 8:
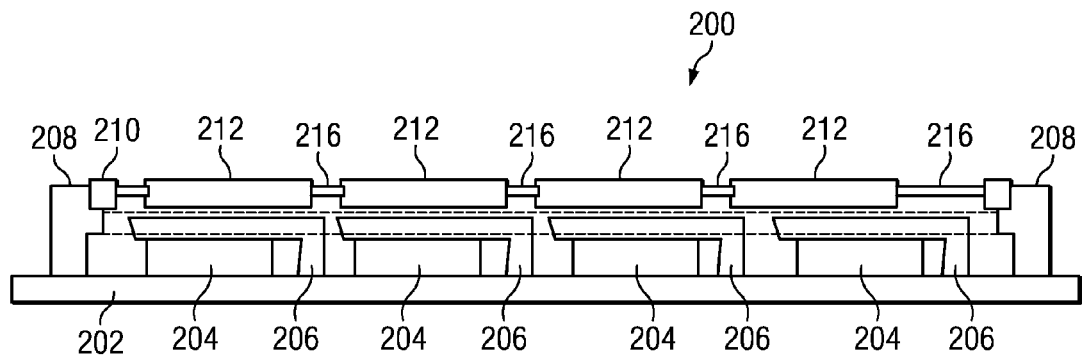
FIG. 8 is a cross-sectional view of a mold structure for forming packaged semiconductor devices.
Figure 9:
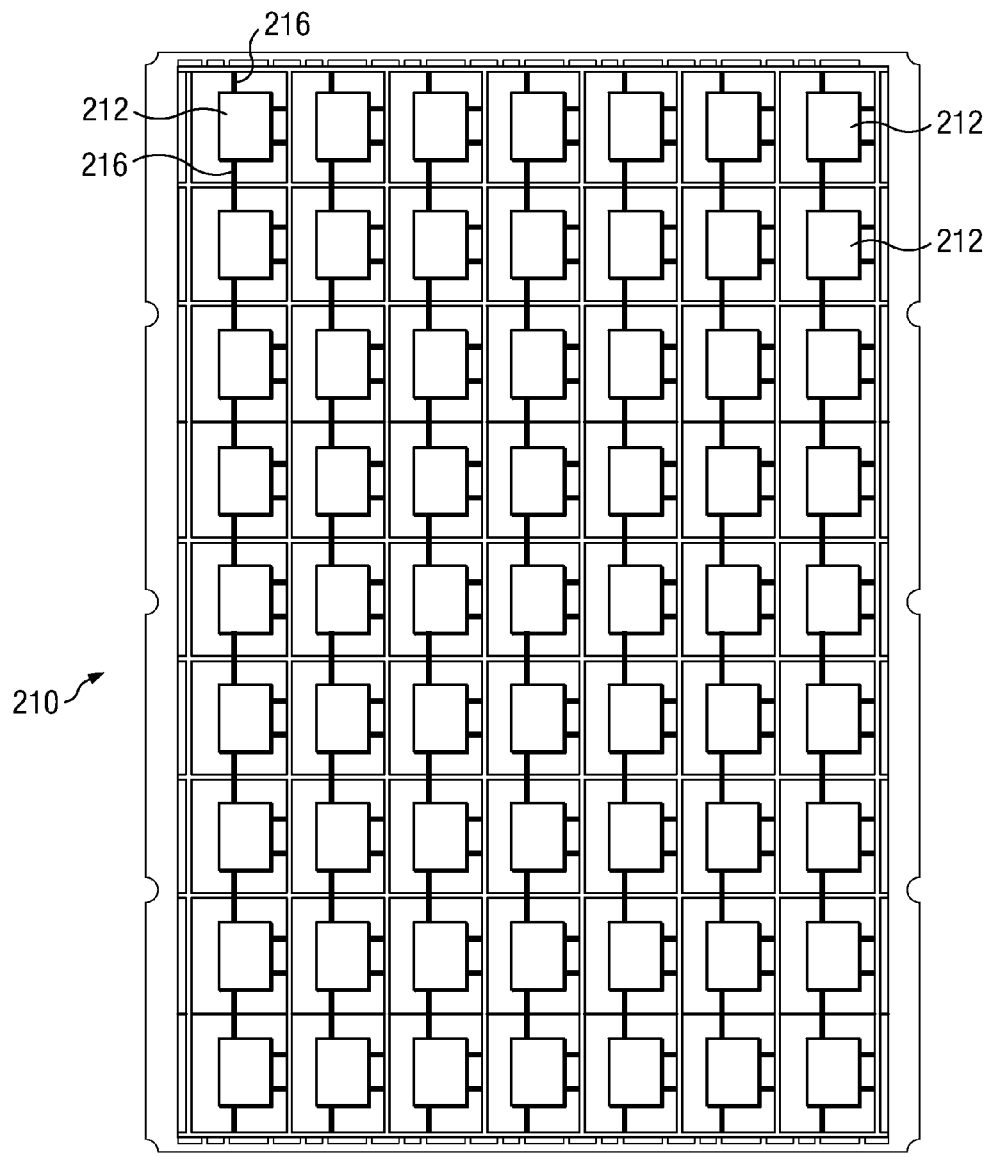
FIG. 9 is a top plan view of an array of heat sinks for use in a mold structure for forming packaged semiconductor devices.
Figure 10:
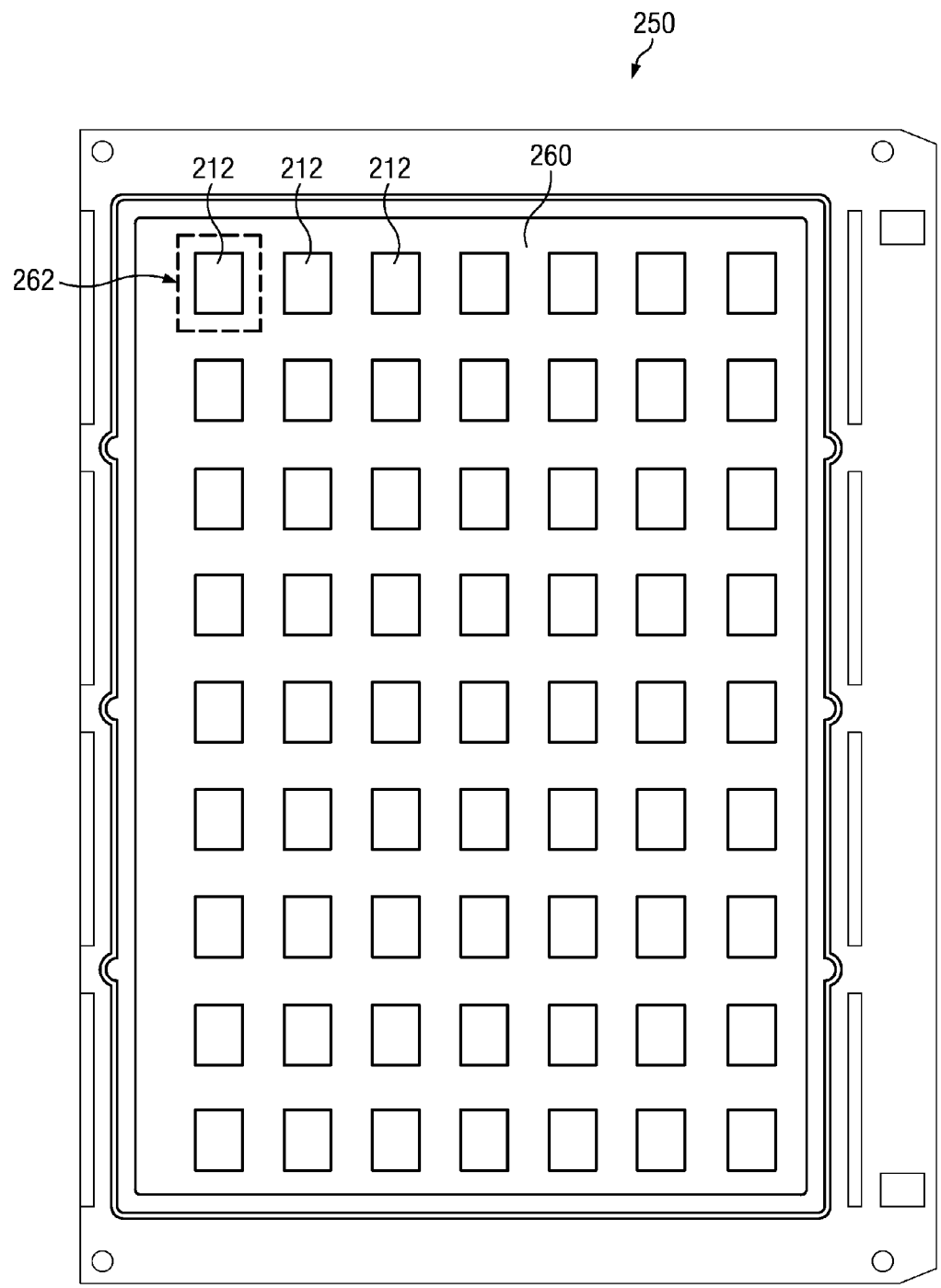
FIG. 10 is a top plan view of a mold structure after molding but before singulation.

FIGS. 8-10 provide additional details of an exemplary method of forming packaged semiconductor devices as discussed above in connection with FIGS. 5 and 6. FIG. 8 is a cross-sectional view of a mold structure 200 for use in a mold tool for overmolding the assemblies discussed above to form packaged semiconductor devices. FIG. 8 shows a lead frame designated generally at 202. An array of semiconductor dies 204 are mounted on the lead frame 202. As discussed above, a layer of solder (not shown) is disposed between the dies 204 and the lead frame 202. A clip structure 206 is disposed over each die 204. A layer of solder (not shown) is disposed between the dies 204 and the clip structures 206. The clip structures 206 may be provided as individual clips and located over their respective die 204 or be provided as an array or matrix of attached clips (and/or attached clip sections) for later singulation. A jig structure 208 is provided to support an array or matrix 210 of connected heat sinks. Portions of the jig are shown in phantom. The jig 208 serves at least two purposes. First, the jig accurately locates the array 210 of heat sinks with respect to the lead frame 202, and thus with respect to the dies 204 and clip structures 206. Second, the jig helps support the weight of the array 210, preventing the undesirable spreading of the solder or epoxy layer disposed between the clip structures 206 and the individual heat sinks 212 within the array 210.

Turning more specifically to the array 210 of heat sinks, a top plan view of an example of such an array is shown in FIG. 9. Assuming a mold block includes sixty-three die sites, the array 210 includes sixty-three heat sinks 212. These heat sinks are connected to each other in the array 210 by arms 216 or other connectors. These connections are cut during the singulation step after molding and may be half-etched to facilitate cutting.

FIG. 10 is a top plan view of a molding structure 250 after molding but before singulation. Molding compound 260 surrounds the exposed heat sinks 212. Dashed border 262 illustrates cut lines for singulating an individual packaged semiconductor device from the mold structure.

One particular benefit of the heat sink design disclosed herein is that the same assembly tooling (e.g., mold and mold tooling) used to form a standard packaged semiconductor device without an embedded heat sink can be used to form a packaged semiconductor device with the heat sink disclosed herein. As the heat sink design does not affect the functionality of the package, the designer can switch back and forth between using and not using the heat sink, as desired, without having to redesign the package, mold or tooling. The mold/tooling combinations and settings are essentially the same, only when the heat sink is not used, that portion of the processing specific to the heat sink placement in the mold is skipped. Further, the same heat sink design can also be used with dies of different sizes. This allows for formation of different devices using the same tooling and process and even allows for the simultaneous formation of different devices in the same mold.

Figure 6:
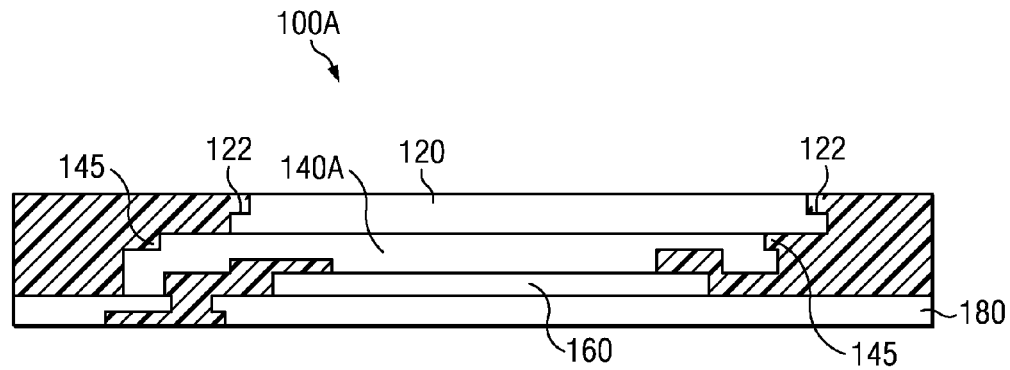
FIG. 6 is a cross-sectional view of another embodiment of a packaged semiconductor device.

FIG. 6 is a cross-sectional view of an embodiment of a packaged semiconductor device 100A. The assembly of FIG. 6 is identical in all respects to the device shown in FIG. 3 except for the provision of an improve moisture trap shown generally in area "A". Having an exposed top side structure, such as heat sink 120, can provide a moisture path from the surroundings to the die. The moisture path follows the interface between the internal components (e.g., heat sink 120 and clip structure 140) and the molding material to the die 120. By providing a double moisture trap around the periphery of the internal components, the ingress of moisture is averted or at least delayed. Because the die is spaced from the surrounding environment by not only the clips structure 140 but also the heat sink 120, a double moisture trap is created. In one embodiment, the double moisture trap is bolstered by misaligning the edges of the heat sink 120 and the clip structure 140A, thereby providing a convoluted moisture path to the semiconductor die surface. Additional moisture protection is provided by periphery shelves 122 and 145 formed in the clip 120 and clip structure 140A, respectively. Finally, additional moisture protection is provided by extending the clip structure 140A beyond the lateral edges of the die 160 in the region A shown in FIG. 100A. All or some of these features can be used to delay or prevent moisture ingress to the die 120.

As noted above, the heat slug 120 and clip 140A is also designed with, for example, peripheral ledges to help lock the components within the encapsulating packaging material.

Figure 7:
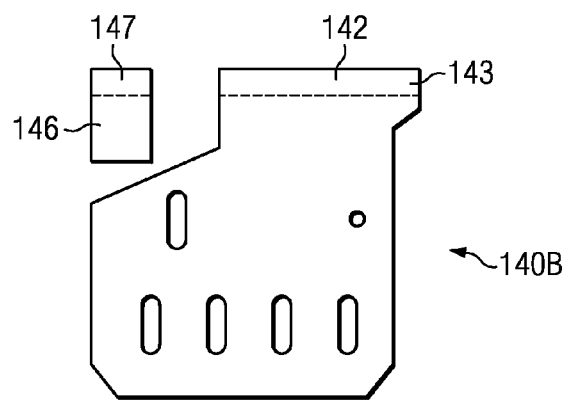
FIG. 7 is a top plan view of an alternative embodiment of a clip structure for use in a packaged semiconductor device.

FIG. 7 is a top plan view of an alternative embodiment of a clip structure 140B that may be used in various embodiments of the disclosed packaged semiconductor device. The clip structure 140B is identical to the clip structure 140 shown in FIG. 2 only the clip structure includes a gate clip structure 147 having a downwardly depending leg 147 (shown in phantom) for contacting gate lead 184. The gate clip structure 146 replaces the wire bond 190, thus simplifying the assembly process. As described in copending and commonly assigned U.S. patent application Ser. No. 11/464,333 filed Aug. 14, 2006 and entitled "Wirebond-less Semiconductor Package", the entirety of which is hereby incorporated by reference herein, the gate clip structure 146 can be attached to the main body (e.g., source) portion of the lead frame structure 140B and then cut or otherwise electrically separated from that portion after molding, such as in a singulation step.

When assembled, the heat sink 120 does not touch the gate clip 146. The gate clip 146 is electrically isolated from the source clip structure and the heat sink 120. In some applications, such as when the top side of the exposed heat sink 120 is to be soldered to an external heat sink, the gate clip needs to be hidden. If the gate clip is exposed at the top surface in these applications, it could be shorted to the heat sink. In the illustrated embodiment, the gate clip 146 is not exposed at the upper surface of the packaged semiconductor device and, therefore, there is no need to half etch the gate clip to hide it. The gate clip 146, therefore, exhibits improved strength during coining and lead bending when compared to half-etched gate clip structures in the prior art and is more resistant to torsion/tensional stresses during molding.

Although the packaged device is shown with only a single die per packaged device, it should be understood that the packaged device may include one or more than one semiconductor die, as well as one or more than one exposed heat sink. It should also be understood that in exemplary embodiments the clip structure is coupled to a lead frame, but in other embodiments a lead frame is not required, such as when a package is employed and fabricated as disclosed in copending, commonly assigned U.S. patent application Ser. No. 11/205,687 entitled "Semiconductor Die Package" and filed Aug. 17, 2005, the entirety of which is hereby incorporated by reference herein. In the '687 application, since the lead contacts of the clip-type structure are not contacted to a lead frame, a tape or other covering means is used to cover the ends of the lead contacts in order to prevent overmolding thereof.

Further, although the semiconductor die is described as being a power MOSFET with source and gate terminals on an upper surface thereof and drain terminal at a bottom surface thereof, it should be understood that the die could be configured with drain and gate terminals at an upper surface thereof and source terminal at a bottom surface thereof. Therefore, a device can be described as having a pair of source/drain terminals and each of these terminals can be referred to as an individual source/drain terminal from the pair of source/drain terminals. Further, the semiconductor device need not be a vertical device. The semiconductor device could be a horizontal device where current flows horizontally and input(s) and output(s) are at the same side of the die. Quasi-vertical devices, where current flows horizontally and vertically may also be utilized.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A semiconductor die package comprising:
    an assembly comprising:
        a lead frame;
        a clip structure;
        a power MOSFET semiconductor die coupled between the lead frame and the clip structure, the die having upper and lower surfaces, the upper surface of the die being attached to a bottom surface of the clip structure with a first layer of conductive solder and the lower surface of the die being attached to an upper surface of the lead frame with a second layer of conductive solder, the upper surface of the die having a first source terminal and a gate terminal and the bottom surface of the die having a second drain terminal,
        a heat sink attached to an upper surface of a portion of the clip structure,
        wherein the clip structure comprises a first source clip electrically coupled to the first source terminal and including a downset portion electrically coupled to a first source lead portion of the lead frame,
        wherein the second drain terminal is electrically coupled to a second drain lead portion of the lead frame;
    the clip structure further includes a gate clip electrically connected to the gate terminal including a downset portion electrically coupled to a gate lead portion of the lead frame; and a molding material partially encapsulating the assembly and side surfaces of the heat sink, wherein an upper surface of the heat sink and a lower surface of the lead frame are exposed through the molding material.

2. The semiconductor die of claim 1, wherein the heat sink comprises a stepped peripheral edge forming a ledge over which said molding material is formed.

3. The semiconductor die package of claim 1, wherein the gate terminal is wire bonded to a gate lead portion of the lead frame.

4. The semiconductor die package of claim 1, wherein the heat sink is attached to the upper surface of the clip structure with a layer of conductive solder.

5. The semiconductor die package of claim 1, wherein the heat sink is attached to the upper surface of the clip structure with a layer of non-conductive epoxy.

* * * * *

UNITED STATES PATENT AND TRADEMARK OFFICE
CERTIFICATE OF CORRECTION

PATENT NO. : 8,049,312 B2  
APPLICATION NO. : 12/352215  
DATED : November 1, 2011  
INVENTOR(S) : Juan Alexandro Herbsommer, Jonathan A. Noquil and Osvaldo J. Lopez Page 1 of 1

It is certified that error appears in the above-identified patent and that said Letters Patent is hereby corrected as shown below:

On the Title Page, item [73]:

Delete: "(73) Assignee: ~~Texas Instruments Incorporated, Dallas, TX (US)~~"

and

Insert: --(73) Assignee: Ciclon Semiconductor Device Corp., Bethlehem, PA (US)--

Signed and Sealed this  
Sixteenth Day of July, 2013

Teresa Stanek Rea  
*Acting Director of the United States Patent and Trademark Office*